(12) United States Patent
Pal et al.

(10) Patent No.: US 10,371,733 B2
(45) Date of Patent: Aug. 6, 2019

(54) COLD SOURCE BASED NOISE FIGURE MEASUREMENT USING S-PARAMETERS AND A VECTOR SIGNAL TRANSCEIVER/VECTOR SIGNAL ANALYZER/SPECTRUM ANALYZER

(71) Applicant: NATIONAL INSTRUMENTS CORPORATION, Austin, TX (US)

(72) Inventors: Prabhat Pal, Bangalore (IN); Vinay Kumar Velkuru, Bangalore (IN); Brian J. Avenell, Santa Rosa, CA (US)

(73) Assignee: National Instruments Corporation, Austin, TX (US)

( * ) Notice: Subject to any disclaimer, the term of this patent is extended or adjusted under 35 U.S.C. 154(b) by 242 days.

(21) Appl. No.: 15/398,074

(22) Filed: Jan. 4, 2017

(65) Prior Publication Data
US 2018/0188306 A1    Jul. 5, 2018

(51) Int. Cl.
G01R 29/26    (2006.01)
G01R 27/28    (2006.01)

(52) U.S. Cl.
CPC ............. *G01R 29/26* (2013.01); *G01R 27/28* (2013.01)

(58) Field of Classification Search
CPC .................................. G01R 29/26; G01R 27/28
USPC ................................. 324/614, 613, 612, 600
See application file for complete search history.

(56) References Cited

U.S. PATENT DOCUMENTS

| | | | | |
|---|---|---|---|---|
| 5,416,422 | A | * | 5/1995 | Dildine .................. G01R 29/26 324/613 |
| 5,854,559 | A | * | 12/1998 | Miranda .................. G01R 1/04 324/750.02 |
| 6,714,898 | B1 | | 3/2004 | Kapetanic |
| 6,898,001 | B2 | | 5/2005 | Ishihara |
| 8,428,533 | B2 | | 4/2013 | Wang |
| 9,939,479 | B2 | | 4/2018 | Ballo |
| 2014/0228672 | A1 | | 8/2014 | Duensing |
| 2015/0177315 | A1 | * | 6/2015 | Lim .................... G01R 31/2834 702/108 |
| 2016/0124032 | A1 | * | 5/2016 | Simpson ................ G01R 29/26 702/69 |
| 2017/0310348 | A1 | * | 10/2017 | Belostotski .............. H04B 1/10 |
| 2017/0319097 | A1 | * | 11/2017 | Amthor .................. A61B 5/055 |

* cited by examiner

*Primary Examiner* — Giovanni Astacio-Oquendo
(74) *Attorney, Agent, or Firm* — Meyertons Hood Kivlin Kowert and Goetzel PC; Jeffrey C. Hood (57) ABSTRACT

The noise figure for a radio frequency device may be obtained through power measurements. A signal flow graph based upon the S-parameter information of the entire RF system may be constructed. The S-parameter information may be representative of the microwave termination, the device, the measurement instrument and any losses due to additional components such as connecting cables/attenuators/switches, etc. The signal flow graph includes proper placement and values of the source nodes corresponding to each RF sub-system enumerated above. Noise figure measurements may include a calibration step and a measurement step. During the calibration step the noise figure and the noise temperature of the measurement instrument used for the measurement may be obtained. During the measurement step, the noise figure and the noise temperature of the device may be obtained based at least on the noise figure and noise temperature of the measurement instrument obtained during the calibration step.

21 Claims, 7 Drawing Sheets

COLD SOURCE BASED NOISE FIGURE MEASUREMENT USING S-PARAMETERS AND A VECTOR SIGNAL TRANSCEIVER/VECTOR SIGNAL ANALYZER/SPECTRUM ANALYZER

FIELD OF THE INVENTION

The present invention relates to the field of instrumentation, and more particularly to performing noise figure measurements using analyzers.

DESCRIPTION OF THE RELATED ART

In many industrial applications (and others), instruments collect data or information from an environment or unit under test (UUT), and may also analyze and process acquired data. Some instruments provide test stimuli to a UUT. Examples of instruments include oscilloscopes, digital multimeters, pressure sensors, arbitrary waveform generators, digital waveform generators, etc. The information that may be collected by respective instruments includes information describing voltage, resistance, distance, velocity, pressure, oscillation frequency, humidity, and/or temperature, among others. Computer-based instrumentation systems typically include transducers for capturing a physical phenomenon and generating a representative electrical signal, signal conditioning logic to perform amplification on the electrical signal, isolation, and/or filtering, and analog-to-digital (A/D) conversion logic for receiving analog signals and providing corresponding digital signals to the host computer system.

In a computer-based system, the instrumentation hardware or device is typically an expansion board plugged into one of the I/O slots of the computer system. In another common instrumentation system configuration, the instrumentation hardware is coupled to the computer system via other means such as through a VXI (VME extensions for Instrumentation) bus, a GPM (General Purpose Interface Bus), a PXI (PCI extensions for Instrumentation) bus, Ethernet, a serial port or bus, or parallel port of the computer system. The instrumentation hardware may include a DAQ (Data Acquisition) board, a computer-based instrument such as a multimeter, or another type of instrumentation device. In another common system configuration, a chassis and boards inserted in the chassis may operate as a standalone instrument or instrument suite, although in some cases a host computer may be used to configure or program the boards prior to, or during operation.

The instrumentation hardware may be configured and controlled by software executing on a host computer system coupled to the system, or by a controller card installed in the chassis. The software for configuring and controlling the instrumentation system typically includes driver software and the instrumentation application software, or the application. The driver software serves to interface the instrumentation hardware to the application and is typically supplied by the manufacturer of the instrumentation hardware or by a third party software vendor. The application is typically developed by the user of the instrumentation system and is tailored to the particular function that the user intends the instrumentation system to perform. The instrumentation hardware manufacturer or third party software vendor sometimes supplies application software for applications that are common, generic, or straightforward. Instrumentation driver software provides a high-level interface to the operations of the instrumentation device. The instrumentation driver software may operate to configure the instrumentation device for communication with the host system and to initialize hardware and software to a known state. The instrumentation driver software may also maintain a soft copy of the state of the instrument and initiated operations. Further, the instrumentation driver software communicates over the bus to move the device from state to state and to respond to device requests.

Instrumentation devices are oftentimes used to measure/determine what is referred to a scattering parameters or S-parameters, which describe the electrical behavior of linear electrical networks when undergoing various steady state stimuli by electrical signals. One type of instrument used for measuring S-parameters is a network analyzer. A vector network analyzer (VNA) is a form of radio frequency (RF) network analyzer widely used for RF design applications. VNAs are a common type of network analyzer, therefore references to a "network analyzer" are most often references to a VNA. S-parameters are measured in terms of power and are useful for electrical engineering, electronics engineering, and communication systems design, and especially for microwave engineering. S-parameters are used to characterize a linear electrical network under load conditions as opposed to open or short circuit conditions. Load terminations are preferable over open/short circuit terminations at high signal frequencies. Many electrical properties of networks of components (inductors, capacitors, resistors) may be expressed using S-parameters, such as gain, return loss, voltage standing wave ratio (VSWR), and reflection coefficient and amplifier stability. S-parameters are mostly used for networks operating at radio frequency (RF) and microwave frequencies, and change with the measurement frequency. Accordingly, in addition to the characteristic impedance or system impedance, the frequency is also specified for S-parameter measurements.

A spectrum analyze is an instrument which provides magnitude versus frequency measurements of an input signal within the full frequency range of the instrumentation device. Spectrum analyzers are primarily used for measuring the spectral power of known and unknown signals. While spectrum analyzers typically receive an electrical input signal, the spectral compositions of other types of signals, e.g. optical light waves and/or acoustic pressure waves may also be determined, by generating corresponding electrical signals—to be provided as input into the spectrum analyzer—through appropriate transducers. By analyzing the spectra of various (electrical) signals, those characteristics of the signals that are not easily detectable in the time domain—e.g. dominant frequency, power, distortion, harmonics, bandwidth, and other spectral components—may be determined. These parameters are useful in the characterization of electronic devices, such as wireless transmitters, for example. One basic type of spectrum analyzer is the vector signal analyzer (VSA). A spectrum analyzer with additional equipment/accessories can also be used as a network analyzer to measure S-parameters. A VSA is used for measuring the magnitude and phase of the input signal at a single frequency within the IF (intermediate frequency) bandwidth of the VSA, which includes making in-channel measurements, such as error vector magnitude, code domain power, and spectral flatness, of known signals.

A vector signal transceiver (VST) is a class of instrumentation that combines a vector signal generator (VSG) and vector signal analyzer (VSA), oftentimes with FPGA-based real-time signal processing and control. One class of VSTs also features a user-programmable FPGA, which allows custom algorithms to be implemented directly into the hardware design of the instrument. This software-designed approach allows a VST to have the flexibility of software-defined radio (SDR) architecture with RF instrument class performance. While the various analyzers have proven versatile, making accurate measurements possible, certain types of measurements still present some challenges. Such is the case, for example, when attempting to measure noise figures of an RF device.

Other corresponding issues related to the prior art will become apparent to one skilled in the art after comparing such prior art with the present invention as described herein.

SUMMARY OF THE INVENTION

In one set of embodiments, the noise figure of an RF device under test (DUT) may be measured using a signal analyzer that uses a passive RF termination as a noise source. The noise figure may be determined based on (or according to) at least a set of parameters and/or characteristics that include: the S-parameters of the DUT, selected characteristic(s)/parameter(s) of the network connecting the RF termination to the input port of the DUT, selected characteristic(s)/parameter(s) of the network connecting the signal analyzer to the output port of the DUT, and the reflection coefficient of the passive RF termination and of the input port of the signal analyzer.

In present day systems, both vector signal analyzers (VSAs) and vector network analyzers (VNAs) may be used to measure noise figures. Noise figure measurements using a spectrum analyzer are typically performed using the Y-factor method, which is based on the Johnson-Nyquist noise of a resistor at two different known temperatures or the noise of a calibrated noise source. When using VNAs, a cold source with impedance tuner is employed to obtain the noise figure (NF) for any source impedance value. In contrast, various embodiments disclosed herein provide a system and method for reutilizing previously measured parameters in a system to derive the NF for a device under test (DUT). Accordingly, the S-parameters of a DUT (for example a low noise amplifier—LNA) may be measured using a VNA using a specified test sequence. Then, the previously measured S-parameters of the DUT and other signal path components may be reutilized to derive the NF of the DUT for a specified source termination, for example a 50Ω source termination.

A signal flow graph may therefore be constructed/obtained based upon the S-parameter information of the entire RF system, including the microwave termination, the DUT, signal analyzer and any losses of the connecting cables/attenuators/switches etc. By constructing the signal flow graph with the proper placement and values of the source nodes corresponding to each RF sub-system, accurate measurements of the noise figure(s) for the RF DUT may be obtained. Accordingly, the noise figure measurement may include at least two steps. A first step may include calibration during which the noise figure and the noise temperature of the signal analyzer used for the measurement are both computed. During a second step, which includes making the actual measurement, the noise figure and the noise temperature of the DUT may be computed.

Based at least on the above, a method for determining a noise figure for a radio frequency (RF) device—using a measurement instrument—may include measuring a first noise power at an output terminal of the measurement instrument when the RF device is not connected to the measurement instrument, and determining a noise figure and noise temperature of the measurement instrument based at least on the measured first noise power and a first signal flow model representative of the signal measurement path exclusive of the RF device. The method may further include measuring a second noise power at the output terminal of the measurement instrument with the RF device connected to the output terminal of the measurement instrument, and determining the noise figure of the RF device based at least on the measured second noise power, the noise figure and noise temperature of the measurement instrument and a second signal flow model representative of the signal measurement path inclusive of the RF device.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the present invention can be obtained when the following detailed description of the preferred embodiment is considered in conjunction with the following drawings, in which.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

It is noted that the various terms or designations for circuits/components and signals as they appear herein, for example in such expressions as "switching circuit", "delay circuit", "source signal", "stimulus signal", etc. are merely names or identifiers used to distinguish among the different circuits/components and/or between different signals, and these terms are not intended to connote any specific meaning, unless directly indicated otherwise.

Embodiments of the present invention may be used in systems configured to perform test and/or measurement functions, to control and/or model instrumentation or industrial automation hardware, or to model and simulate functions, e.g., modeling or simulating a device or product being developed or tested, etc. More specifically, it may be used in various instances where noise figure measurements for one or more different radio frequency (RF) devices or RF devices under test may be required. However, it is noted that the present invention may equally be used for a variety of applications, and is not limited to the applications enumerated above. In other words, applications discussed in the present description are exemplary only, and the present invention may be used in any of various types of systems. Thus, the system and method of the present invention may be used in any number of different applications. It is noted that the various terms or designations for circuits/components as they appear herein, such as "feedback circuit", "measurement circuit", etc. are merely names or identifiers used to distinguish among the different circuits/components, and these terms are not intended to connote any specific, narrowly construed meaning.

Figure 1:
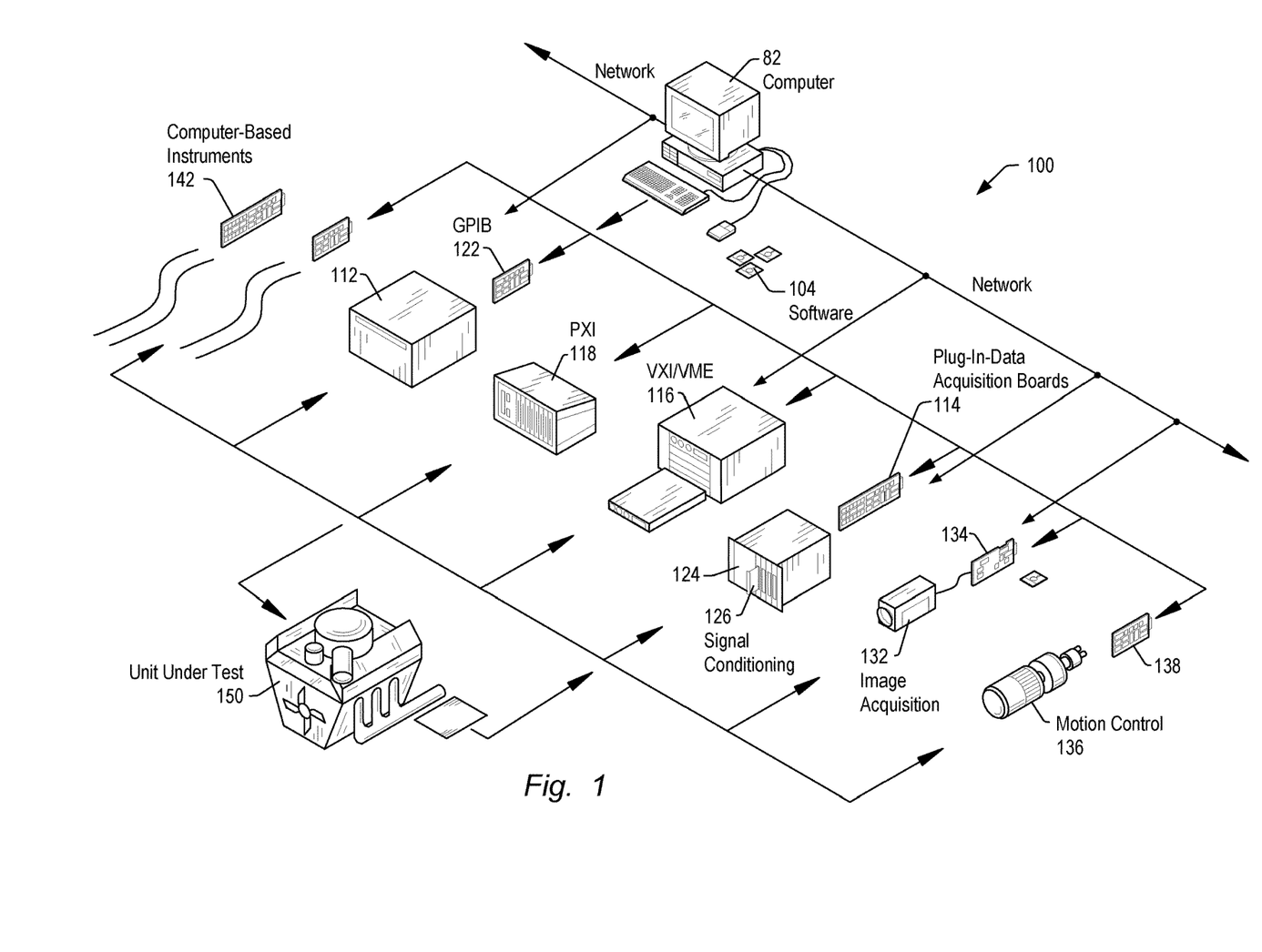
FIG. 1 shows an instrumentation control system with instruments networked together according to some embodiments.

FIG. 1 illustrates an exemplary instrumentation control system 100 which may be configured according to embodiments of the present invention. System 100 comprises a host computer 82 which may couple to one or more instruments configured to perform a variety of functions using timing control implemented according to various embodiments of the present invention. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices.

The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
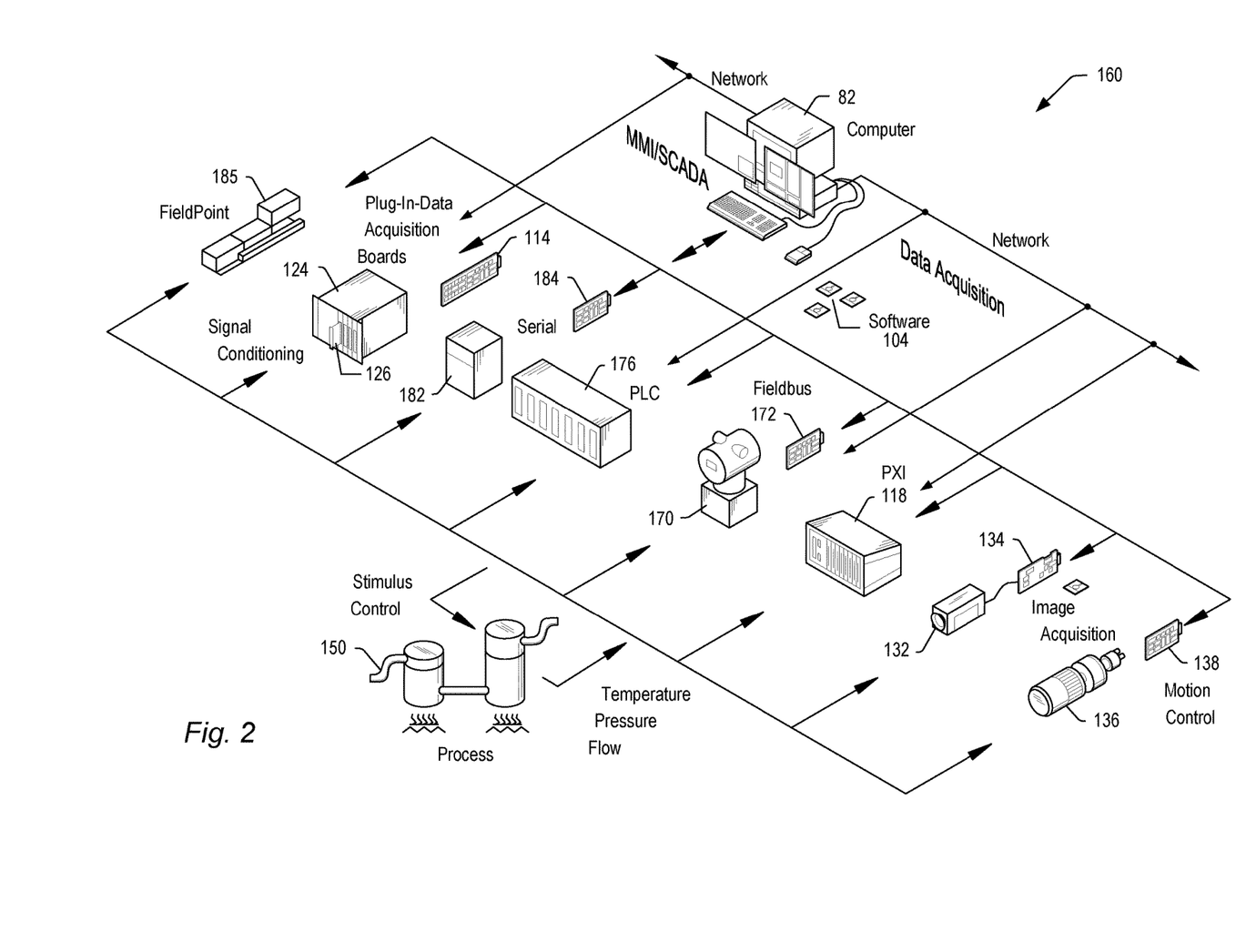
FIG. 2 shows an industrial automation system with instruments networked together according to some embodiments.

FIG. 2 illustrates an exemplary industrial automation system 160 that may include embodiments of the present invention. Industrial automation system 160 may be similar to instrumentation or test and measurement system 100 shown in FIG. 2A. It should be noted that both systems 100 and 160 are merely shown as examples, and various embodiments of systems and methods of noise figure measurement of RF device(s) described herein may be used in a variety of other instrumentation or test configurations. Elements that are similar or identical to elements in FIG. 1 have the same reference numerals for convenience. System 160 may comprise a computer 82 which may couple to one or more devices and/or instruments configured to perform a variety of functions using timing control implemented according to various embodiments of the present invention. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection.

Vector Signal Transceivers, Vector Signal Analyzers, Spectrum Analyzers

Figure 3:
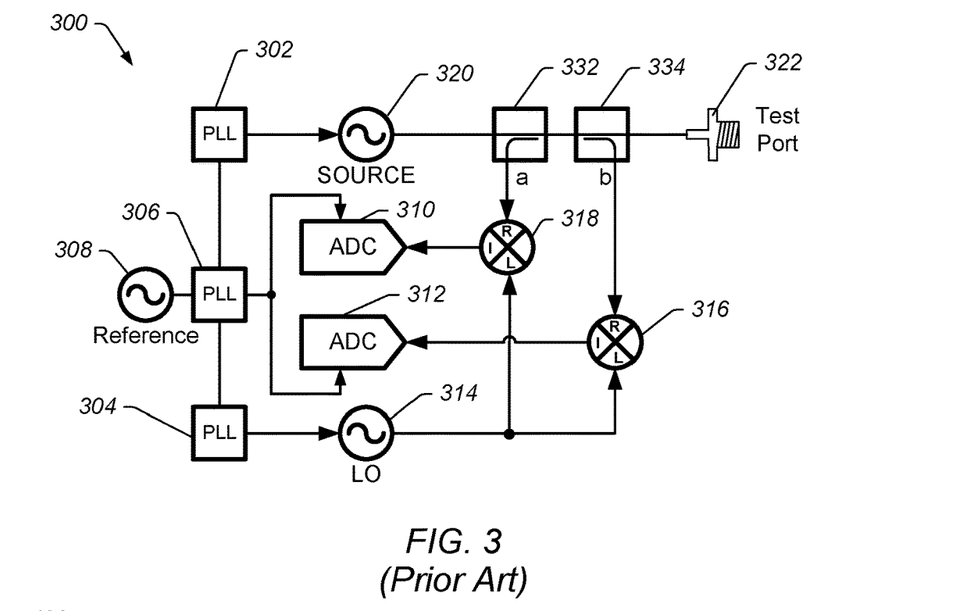
FIG. 3 shows a simplified block diagram of a vector network analyzer, according to prior art.

In some embodiments, measurement or measuring instruments and devices, such as those shown in FIG. 1, may include vector signal generators (VSG), vector signal analyzers (VSA), and/or vector signal transceiver (VST) instruments. The simplified block diagram featuring the components of interest of a traditional VNA 300 is shown in FIG. 3. A reference signal generator 308 provides a periodic (clock) signal to phase-locked loops (PLLs) 302, 304, and 306. PLL 302 is used by source signal generator 320 to generate the test signal to be output at test port 322, which may be coupled to a device under test (DUT; not shown) for which testing may be performed. The signal provided by source 320 to test port 322 is transmitted through two separate directional couplers, directional coupler 332 and directional coupler 334 as shown, where 'a' and 'b' represent respective coupled ports of directional couplers 332 and 334. Accordingly, signal 'a' represents a coupled signal output by directional coupler 332, and signal 'b' represents a coupled signal output by directional coupler 334. As configured in system 300, signal 'a' corresponds to a measure of the energy transmitted from test port 322, and signal 'b' corresponds to a measure of the energy entering test port 322 from outside system 300. Thus, the ratio 'b'/'a' provides a measure of the amount of energy reflected back from a DUT (to which test port 322 may be coupled) relative to the energy incident on test port 322, and is referred to as the voltage reflection coefficient. In other words, signal 'a' provides a measure of the incident power on test port 322, and signal 'b' provides a measure of the reflected power on test port 322. It should also be noted that as used herein, the expressions 'voltage reflection coefficient', 'energy reflection coefficient', and 'power reflection coefficient' are used interchangeably.

In one set of embodiments, system 300 may be designed such that signals 'a' and 'b' have small values compared with the actual incident and reflected power, respectively. This may be achieved by choosing the appropriate or desired (small) coupling factor, e.g. a coupling factor of −15 dB or −20 dB for each of directional couplers 332 and 334. It should also be noted that the inclusion and configuration of directional couplers 332 and 334 represents one possible way to obtain signals representative of the measured incident and reflected power on test port 322. In the configuration shown in FIG. 3, directional couplers 332 and 334 are coupled in series. Two identical directional couplers may be used, with one of the directional couplers reverse coupled. That is, directional coupler 332 may be connected to couple the forward wave, that is, it may be connected to obtain signal 'a' representative of the power incident on, or leaving test port 322. Conversely, directional coupler 334 may be reverse connected to couple the reverse wave, that is, it may be connected to obtain signal 'b' representative of the power reflected on, or entering test port 322. It should be noted that there are dual directional couplers that provide the functionality of couplers 332 and 334 in a single device, and a directional bridge may also be used to perform the same function. Overall, one skilled in the art will appreciate the different ways in which signals 'a' and 'b', as defined above, may be obtained based on the source signal coupled to test port 322.

PLL 304 provides a periodic signal from which a local oscillator (LO) 314 generates the local oscillator signal for receivers 316 and 318. The respective outputs from receivers 316 and 318 are provided to analog-to-digital converters (ADCs) 310 and 312, from which the digitized signal information may be made available, for example to a digital signal processing (DSP) unit (not shown). The phase noise from source 320 and LO 314 are correlated within the PLL bandwidth, which is usually very narrow (<1 kHz). A significant portion of the total phase noise energy is beyond that frequency range, and is uncorrelated. The individual phase measurements for 'a' and 'b' are noisy (indicated at the respective outputs of receivers 316 and 318), since they contain the sum of the uncorrelated phase noise from LO 314 and source 320. However the sum of this phase noise will be correlated between 'a' and 'b' since the two measurements were taken synchronously, therefore the noise effectively cancels when the ratio of 'b'/'a' is obtained. The result is a cancellation of the phase noise originating from LO 314 and source 320, when measuring the ratio of the signals 'b' and 'a'.

Figure 4:
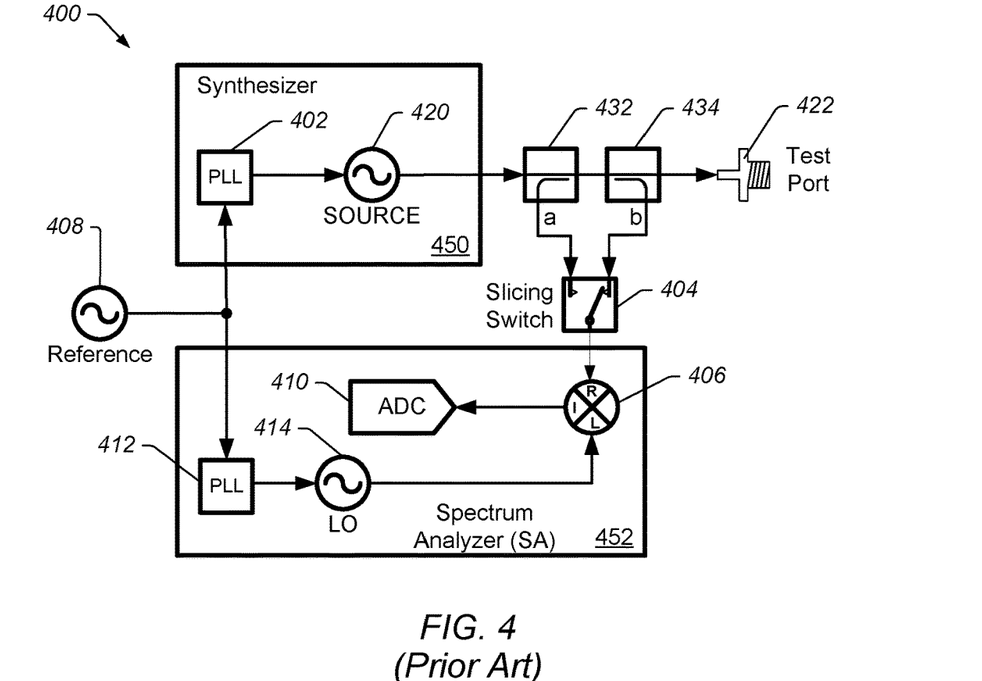
FIG. 4 shows a simplified block diagram of a vector signal analyzer that utilizes a single receiver, according to prior art.

The simplified block diagram featuring the components of interest of a traditional VSA 400 utilizing a single receiver is shown in FIG. 4. While VSA 400 is similar to VSA 300, in this case a synthesizer 450 is used to generate the test signal through a PLL 402 and signal source 420. A spectrum analyzer (SA) 452 includes a single receiver 406 receiving either signal 'a' or signal 'b' depending on the position of slicing switch 404. Signals 'a' and 'b' are generated through directional couplers 432 and 434, respectively, in a manner similar to how signals 'a' and 'b' are generated in system 300. A reference signal generator 408 provides the periodic control signal to PLL 402, as well as PLL 412 in SA 452, which also includes LO 414 and an ADC 410 to obtain a digitized version of the receiver output for further processing/analyzing. The phase noise from source 420 and the phase noise from LO 414 are correlated within the PLL bandwidth (similar to VSA 300), which, again is usually very narrow (<1 kHz). A significant portion of the total phase noise energy is uncorrelated and beyond that frequency range. The individual phase measurements for signal 'a' and signal 'b' are noisy, since they contain the sum of the uncorrelated phase noise from LO 414 and source 420. Since signals 'a' and 'b' are measured at different times, the total noise in one signal remains uncorrelated to the total noise in the other signal, and as a result there is no significant noise cancellation during the division of 'b' by 'a' (i.e. when obtaining 'b'/'a'). This results in a noisier ratio measurement of 'b'/'a', which has to be corrected by performing more averaging, or using a smaller intermediate frequency (IF) bandwidth, all of which typically result in a slower measurement.

Figure 5:
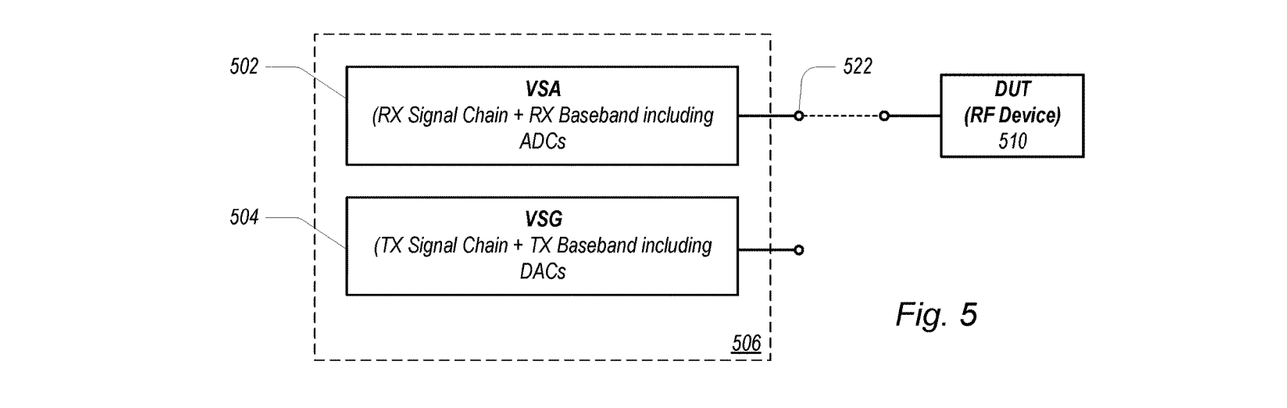
FIG. 5 shows an exemplary vector signal transceiver that includes a vector signal analyzer, according to some embodiments.

FIG. 5 shows the block diagram of an exemplary VST that includes a VSA 502 having an RX signal chain and baseband including ADCs, and a VSG 504 having a TX signal chain and baseband including DACs. VSA 502 and VSG 504 are shown are part of a VST 506, but in alternate embodiments the TX and RX chains, respectively, may not necessarily be part of a VST, and may represent two independent transmission paths in different pieces of hardware (equipment). Furthermore, a VSG may be defined as a cascade configuration of a VSG and a power amplifier. A VSA may be defined as a cascade configuration of an LNA and a VSA.

Figure 6:
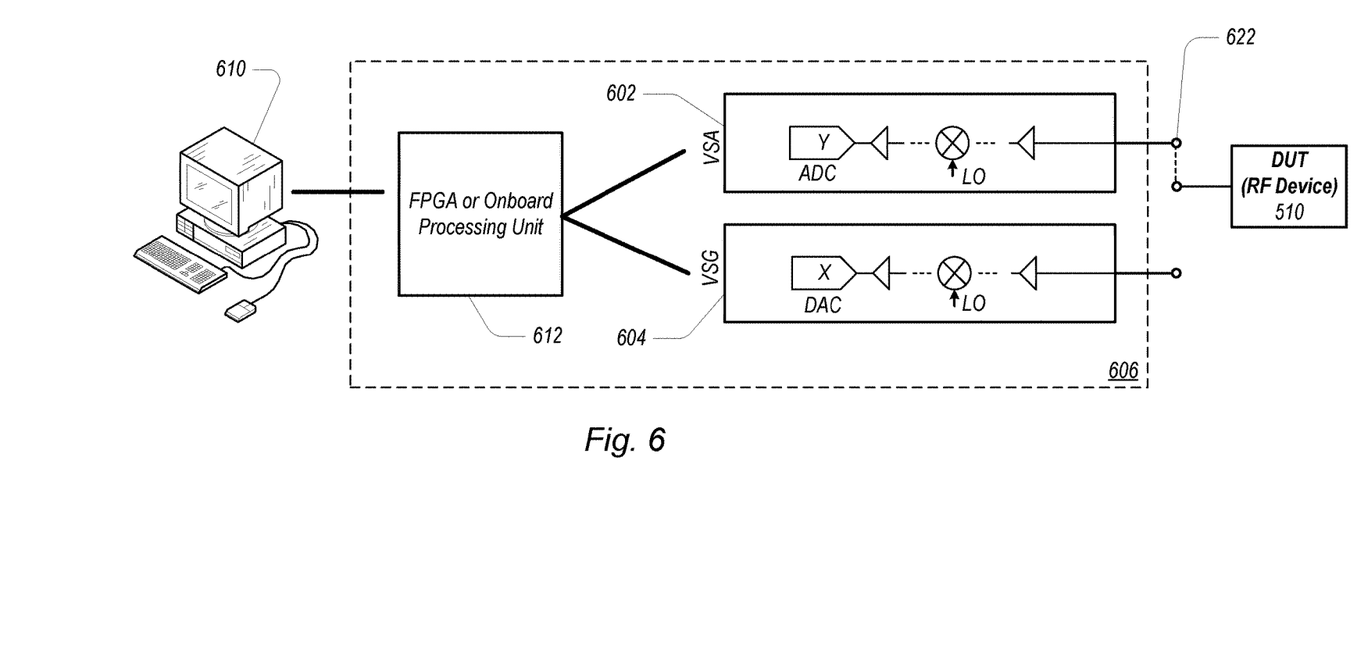
FIG. 6 shows the block diagram of an exemplary transceiver system that includes a vector signal analyzer, according to some embodiments.

Accordingly, in some embodiments, a VSA may be defined as an LNA (low noise amplifier) followed by a VSA, or the VSG may be defined as a VSG followed by a high power amplifier. FIG. 6 shows one embodiment of the system block diagram, including the system input X representing what is generated from the DAC included in VSG 604, and the system output Y representing what is read off the DAC included in VSG 604. A test or measurement system 606 is shown to include an onboard processing unit 612, which may be an FPGA (field programmable gate array) or a semi-custom or custom piece of hardware capable of providing and capturing the signals to and from VSG 604 and VSA 602, respectively. As shown in FIG. 6, a first signal path included in VSG 604 is a TX chain that includes the DAC, and a mixer to produce the RF signal from the converted received baseband signal according to a local oscillator (LO) signal. The input of VSA 602 includes a second signal path that is an RX chain with a mixer to recover a received baseband signal through the use of a mixer according to an LO signal, and providing a digital signal to the onboard processing unit 612 through the ADC. A local host or computer 610 may be used to control/interface with system 606. In some embodiments, inputs provided to host 610 may be converted to the desired signals by onboard processing unit 612, which may also capture the output from VSA 602, and provide data/information back to host 610 for further processing as desired. That is, processing, including providing the signal to be written to the DAC and analyzing the signal read from the ADC, performed either on the onboard processing unit 612 or on the host computer 612, or a combination of both.

It should be noted that the various instruments, including signal generators, signal analyzers and signal transceivers detailed above are presented as possible instruments/instrumentation that may be used for implementing the various embodiments of performing RF noise measurements on DUTs. However, such measurements may be performed using a variety of other instruments and/or instrumentation similarly suitable for performing the RF noise measurements as disclosed herein.

Performing Noise Measurements on RF Devices—Calibration

In some embodiments, measuring the RF noise figure(s) for DUTs may include a calibration process and a measurement process. The calibration process is performed for obtaining noise figure(s) and noise temperature corresponding to (or associated with) the measurement instrument, while the measurement process is performed to obtain the noise figure(s) and noise temperature of the DUT in accordance with (i.e. taking into account) the noise figure(s) and noise temperature obtained during the calibration process. For performing the calibration (process), a specified termination or RF termination of specified impedance, e.g. 50 ohm RF termination may be used. The specified termination may correspond to a (power) source used with/for the measurement instrument used for performing the measurement. Since typically no termination provides a perfect impedance match, it may be beneficial to obtain the reflection coefficient (value) of the termination, along with the S-parameters of any loss between the termination (source) and the measurement instrument (e.g. signal analyzer). More generally, the reflection coefficient of the termination (power source), and the S-parameters corresponding to intermediary/additional components of the measurement system (e.g. connecting cables and/or other components present between the termination (source) and the instrument) may be obtained. In addition, the reflection coefficient of the instrument (e.g. signal analyzer) may also be obtained.

Figure 7:
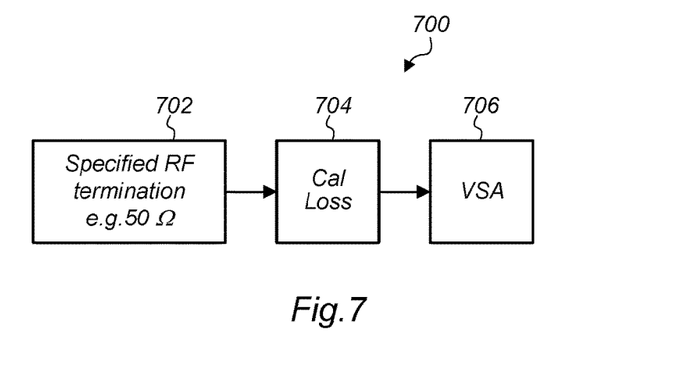
FIG. 7 shows an exemplary flow diagram of calibration steps for measuring the noise figure of a radio frequency device, according to some embodiments.

For calibration of the measurement instrument (e.g. signal analyzer), a signal flow graph may be constructed as shown in FIG. 7. The graph in FIG. 7 illustrates an exemplary setup 700 for calibration, according to some embodiments. As shown in FIG. 7, for performing a calibration measurement, the reflection coefficient of the specified termination (source) is obtained/measured (702). The S-parameters corresponding to (or associated with) any loss between the termination and the signal analyzer are obtained/measured (704). Finally, the reflection coefficient of the instrument (e.g. signal analyzer) is also obtained/measured (706).

Figure 8:
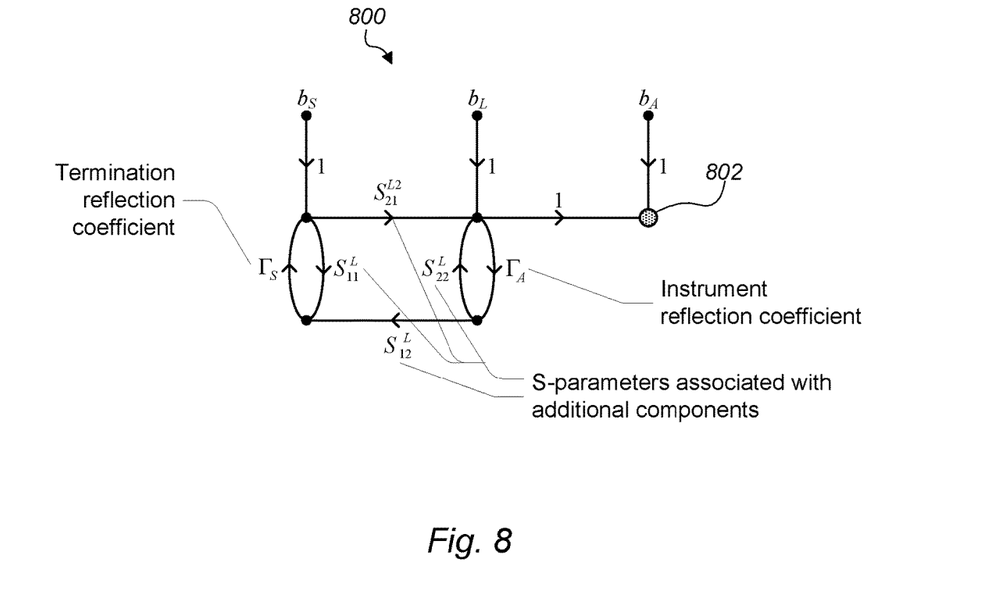
FIG. 8 shows an exemplary signal flow graph corresponding to the flow diagram of FIG. 7, according to some embodiments.

FIG. 8 shows an exemplary flow graph corresponding to the calibration process and corresponding to the setup (sequence) 700 shown in FIG. 7. The various parameters (or values representative thereof) and/or characteristics (or values representative thereof) are defined as follows:

$b_S^2 = k_B T_S B (1-|\Gamma_S|^2)$ is the available-power from the source (e.g. the RF termination), associated with 702 from FIG. 7.

$b_L^2 = k_B T_L G_L B (1-|\Gamma_L^{OUT}|^2)$ is the available-power from the lossy elements, e.g. from the additional components (components in addition to the source/termination and the measurement instrument), associated with 704 from FIG. 7.

$b_A^2 = k_B T_A B$ is the noise power contributed by (or associated with) the signal analyzer, associated with 706 from FIG. 7.

The symbols representing the parameters identified in FIG. 7 are annotated in FIG. 8.

The superposition of noise powers resulting from the above referenced three independent sources (termination, additional components, instrument) may be measured using the measurement instrument set up for performing the measurement, (e.g. a signal analyzer). In the diagram of FIG. 8, the final power resulting from the superposition of the noise powers is represented at node 802. From the measured power, and based also at least on the previously obtained parameter values (as indicated in FIG. 7), the noise-temperature $T_A$ may be extracted/determined, and the available gain may be obtained. In some embodiments, the available gain $G_L$ is given by:

$$G_L = \frac{(1-|\Gamma_S|^2)}{|1-S_{11}^L \Gamma_S|^2} |S_{21}^L|^2 \frac{1}{(1-|\Gamma_L^{OUT}|^2)},$$

where the output reflection coefficient is given by $$\Gamma_L^{OUT} = S_{22}^L + \frac{S_{21}^L S_{12}^L \Gamma_S}{1-S_{11}^L \Gamma_S}.$$

The signal flow graph shown in FIG. 8 may be solved using Mason's method, also known as Mason's gain formula which is a method for finding the transfer function of a linear signal-flow graph, which yields the noise temperature $T_A$ as set forth above, which completes the calibration process. It may be noted for reference, that Mason's gain formula provides a method for algebraically determining the transfer function by labeling each signal, providing an equation that expresses that signal's dependence on the other signals, and solving the multiple equations for the output signal in terms of the input signal.

Performing Noise Measurements on RF Devices—Measurement

Figure 9:
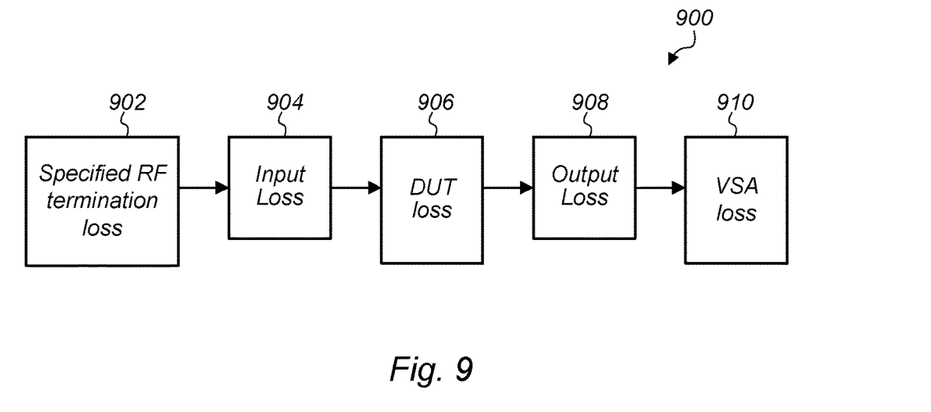
FIG. 9 shows an exemplary flow diagram of measurement steps for measuring the noise figure of a radio frequency device, according to some embodiments.

For performing the measurement (process), the measurement instrument (e.g. signal analyzer) may be used to measure the respective noise contributed by the specified termination (e.g. the respective noise contributed by the 50Ω termination), the respective noise contributed by the RF losses at the input and output ports of the DUT, the respective noise contributed by the DUT, and the respective noise contributed by the measurement instrument (e.g. by the signal analyzer). This is illustrated by way of exemplary sequence 900 shown in FIG. 9. The respective noise contributed by the specified termination is represented by 902. Also represented are the respective noise contributed by the RF losses at the input port of the DUT (904), the respective noise contributed by the DUT (906), the respective noise contributed by the RF losses at the output port of the DUT (908), and the respective noise contributed by the measurement instrument (910).

Figure 10:
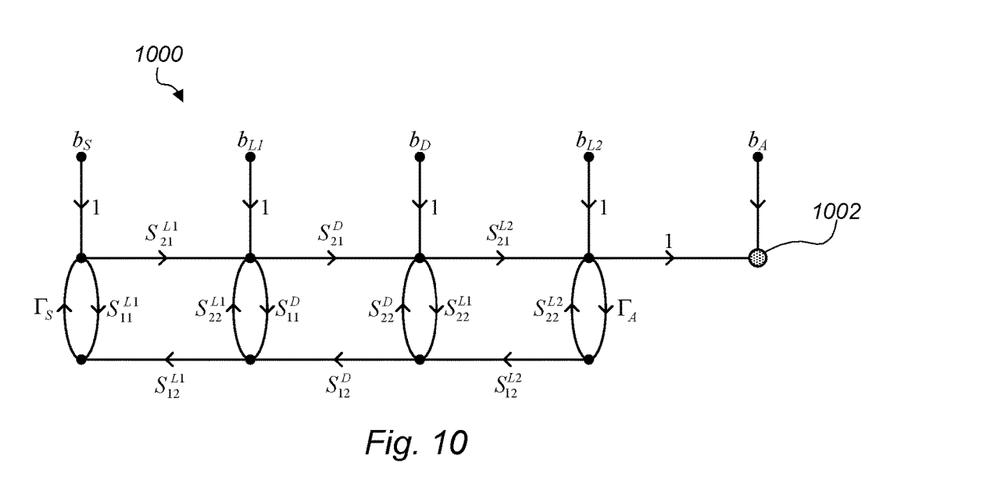
FIG. 10 shows an exemplary signal flow graph corresponding to the flow diagram of FIG. 9, according to some embodiments.

The available powers from source nodes, $b_S$ and $b_A$ remain the same as during the calibration. Powers corresponding to other source nodes are illustrated in the signal flow graph shown in FIG. 10 and are associated with the block diagram shown in FIG. 9. The available powers in addition to the available powers from source nodes, $b_S$ and $b_A$ may be expressed by the following equations:

$b_{L1}^2 = k_B T_{L1} B G_{L1} (1-|\Gamma_{OUT}^{L1}|^2)$, available power from loss at DUT input, $b_{L2}^2 = k_B T_{L2} B G_{L2} (1-|\Gamma_{OUT}^{L2}|^2)$, available power from loss at DUT output, $b_D^2 = k_B T_D B G_D (1-|\Gamma_{OUT}|^2)$, available-power from the loss at the DUT.

Other (previously not appearing) terms that appear in the expression for available power from the source nodes shown in FIG. 8 are the available gain of the input loss element, which can be determined from previously obtained S-parameters as follows:

$$G_{L1} = \frac{(1-|\Gamma_S|^2)}{|1-S_{11}^{L1}\Gamma_S|^2}|S_{21}^{L1}|^2 \frac{1}{(1-|\Gamma_{L1}^{OUT}|^2)}$$

where the output reflection coefficient of the input loss is:

$$\Gamma_{L1}^{OUT} = S_{22}^{L1} + \frac{S_{21}^{L1}S_{12}^{L1}\Gamma_S}{1-S_{11}^{L1}\Gamma_S}.$$

Similar expressions for the available gain of the DUT ($G_D$) and of the output loss ($G_{L2}$) may also be derived as follows:

$$G_D = \frac{(1-|\Gamma_{L1}^{OUT}|^2)}{|1-S_{11}^{D}\Gamma_{L1}^{OUT}|^2}|S_{21}^{D}|^2 \frac{1}{(1-|\Gamma_D^{OUT}|^2)}$$

$$G_{L2} = \frac{(1-|\Gamma_D^{OUT}|^2)}{|1-S_{11}^{L2}\Gamma_D^{OUT}|^2}|S_{21}^{L2}|^2 \frac{1}{(1-|\Gamma_{L2}^{OUT}|^2)}$$

where the output port reflection coefficients of the DUT ($\Gamma_D^{OUT}$) and output loss ($\Gamma_{L2}^{OUT}$) are expressed as:

$$\Gamma_D^{OUT} = S_{22}^{D} + \frac{S_{21}^{D}S_{12}^{D}\Gamma_{L1}^{OUT}}{1-S_{11}^{D}\Gamma_{L1}^{OUT}}$$

$$\Gamma_{L2}^{OUT} = S_{22}^{L2} + \frac{S_{21}^{L2}S_{12}^{L2}\Gamma_D^{OUT}}{1-S_{11}^{L2}\Gamma_D^{OUT}}$$

The unknown variable $T_D$ in the expression for $b_D^2$, is the equivalent noise temperature of the DUT. This is the only unknown in the entire signal flow graph shown in FIG. 10, and it may be extracted from the measured noise, after solving the signal flow graph of FIG. 10.
The noise figure of the DUT may then be provided by:

$$F_D = 1 + \frac{T_D}{T_0}$$

where $T_0$=290 K.

Exemplary Method for Measuring Noise Figure of an RF DUT

Figure 11:
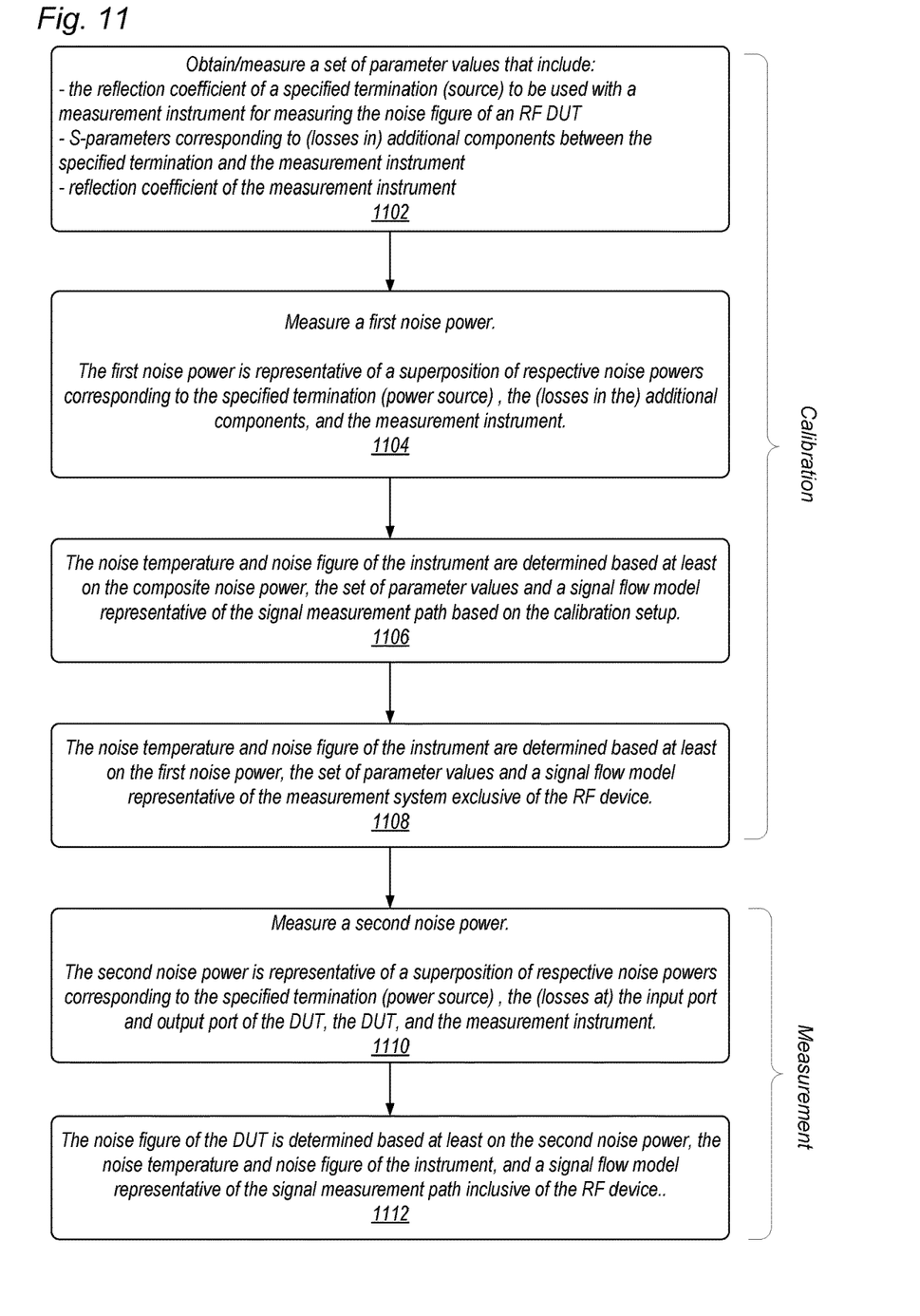
FIG. 11 shows and exemplary flow diagram of a method for measuring the noise figure of a radio frequency device, according to some embodiments.

According to at least the above, a method for measuring the noise figure of an RF device or RF device under test (DUT) may be performed as illustrated in FIG. 11. The DUT may be tested using a VNA and/or VSA, e.g. as shown in FIG. 5 and FIG. 6 where DUT 510 is coupled to measurement instruments 506 and 606, respectively. The systems shown in FIG. 5 and FIG. 6 are provided as exemplary systems suitable for performing the noise figure measurements as described herein. First, a calibration may be performed using the following components: the instrument that will be used to perform the measurement, additional components (e.g. interconnecting element such as cables, etc.), the DUT, and a specified RF termination (source). During the calibration, the noise figure and the noise temperature of the instrument is determined based at least on a power measurement performed at an output terminal of the instrument, and a reflection coefficient of the specified termination, the reflection coefficient of the instrument, and S-parameters corresponding to a power loss between the specified termination and the instrument.

Accordingly, the following parameters (or parameter values) may be obtained/measured: the reflection coefficient of the specified termination (source) to be used with a measurement instrument for measuring the noise figure of an RF Device Under Test, S-parameters corresponding to (losses in) additional components between the specified termination and the measurement instrument, and the reflection coefficient of the measurement instrument (1102). Subsequently, a composite noise power may be measured at an output terminal of the measurement instrument (1104). The composite noise power is representative of a superposition of respective noise powers corresponding to the specified termination (power source), the (losses in the) additional components, and the measurement instrument. The noise temperature and noise figure of the instrument are then determined based at least on the composite noise power, the previously obtained/measured set of parameter values and a signal flow model representative of the signal measurement path based on the calibration setup (1106).

Once calibration has been performed, the DUT may be coupled to the output port of the measurement instrument, and new measurements may be performed. Specifically, a second noise power may be measured at the output terminal of the measurement instrument (1110). The second noise power is representative of a superposition of respective noise powers corresponding to the specified termination (power source), the (losses at) the input port and output port of the DUT, the DUT, and the measurement instrument. The noise figure of the DUT is then determined based at least on the second noise power, the noise temperature and noise figure of the instrument, and a signal flow model representative of the signal measurement path based on the measurement setup (1112).

Although the embodiments above have been described in considerable detail, numerous variations and modifications will become apparent to those skilled in the art once the above disclosure is fully appreciated. It is intended that the following claims be interpreted to embrace all such variations and modifications.

We claim:
1. A method for determining a noise figure for a radio frequency (RF) device, using a measurement instrument, the method comprising:
  measuring a first noise power when the RF device is not connected to the measurement instrument;
  determining a noise figure and noise temperature of the measurement instrument based at least on the measured first noise power and a first signal flow model representation of a signal measurement path exclusive of the RF device;
  measuring a second noise power when the RF device is connected to the measurement instrument; and
  determining a noise figure of the RF device based at least on the measured second noise power, the noise figure and noise temperature of the measurement instrument and a second signal flow model representative of the signal measurement path inclusive of the RF device.

2. The method of claim 1, wherein said measuring the first noise power and said measuring the second noise power are performed for a first termination coupled to an input of the measurement instrument and having a specified first impedance.

3. The method of claim 2, further comprising performing at least one of the following, prior to said measuring the first noise power:
obtaining a reflection coefficient value of the first termination;
obtaining S parameters corresponding to intermediary components comprised in the measurement system between the termination and the measurement instrument; or
obtaining a reflection coefficient value of the measurement instrument.

4. The method of claim 3, wherein said determining the noise figure and the noise temperature of the measurement instrument comprises determining the noise figure and the noise temperature of the measurement based on at least one of the following:
the obtained reflection coefficient value of the first termination;
the obtained S parameters; or
the obtained reflection coefficient value of the measurement instrument.

5. The method of claim 1, wherein the first noise power is representative of a superposition of:
available power corresponding to a first termination coupled to an input of the measurement instrument and having a specified first impedance;
available power corresponding to intermediary components comprised in the measurement system between the termination and the measurement instrument; and
noise power associated with the measurement instrument.

6. The method of claim 1, wherein the second noise power is representative of a superposition of:
available power corresponding to a first termination coupled to an input of the measurement instrument and having a specified first impedance;
available power corresponding to power loss at an input of the RF device;
available power corresponding to power loss at the RF device;
available power corresponding to power loss at an output of the RF device; and
noise power associated with the measurement instrument.

7. The method of claim 6, wherein said determining the noise figured of the RF device comprises calculating the noise figure of the RF device according to the second signal flow model from:
the measured second noise power;
the available power corresponding to the first termination;
the available power corresponding to the power loss at the input of the RF device;
the available power corresponding to the power loss at the RF device;
the available power corresponding to the power loss at the output of the RF device; and
the noise power associated with the measurement instrument.

8. A measurement system comprising:
a measurement instrument configured to couple to a device under test (DUT); and
a processing unit configured to interoperate with the measurement instrument to:
measure a first noise power when the DUT is not connected to the measurement instrument;
determine a noise figure and noise temperature of the measurement instrument based at least on the measured first noise power and a first signal flow model representative of a signal measurement path exclusive of the DUT;
measure a second noise power when the DUT is connected to the the measurement instrument; and
determine a noise figure of the DUT based at least on the measured second noise power, the noise figure and noise temperature of the measurement instrument and a second signal flow model representative of the signal measurement path inclusive of the DUT.

9. The measurement system of claim 8, further comprising:
a first power source configured to provide power to the measurement instrument and having a specified first impedance.

10. The measurement system of claim 9, further comprising:
intermediary components coupling the first power source to the measurement instrument;
wherein the processing unit is configured to interoperate with the measurement instrument to:
obtain a reflection coefficient value of the first power source;
obtain S parameters corresponding to the intermediary components; and
obtain a reflection coefficient value of the measurement instrument.

11. The measurement system of claim 10, wherein the processing unit is configured to interoperate with the measurement instrument to:
determine the noise figure and the noise temperature of the measurement instrument based in addition on at least one of the following:
the obtained reflection coefficient value of the first power source;
the obtained S parameters; or
the obtained reflection coefficient value of the measurement instrument.

12. The measurement system of claim 8, wherein first noise power is representative of a superposition of:
available power corresponding to a first power source coupled to an input of the measurement instrument and having a specified first impedance;
available power corresponding to intermediary components coupling the first power source to the measurement instrument; and
noise power associated with the measurement instrument.

13. The measurement system of claim 8, wherein the second noise power is representative of a superposition of:
available power corresponding to a first power source coupled to an input of the measurement instrument and having a specified first impedance;
available power corresponding to power loss at an input of the DUT coupled to the output of the measurement instrument;
available power corresponding to power loss at the DUT;
available power corresponding to power loss at an output of the DUT; and
noise power associated with the measurement instrument.

14. The measurement system of claim 13, wherein the processing unit is configured to interoperate with the measurement instrument to calculate the noise figure of the DUT according to the second signal flow model from:

the measure second noise power;
the available power corresponding to the first power source;
the available power corresponding to the power loss at the input of the DUT;
the available power corresponding to the power loss at the DUT;
the available power corresponding to the power loss at the output of the DUT; and
the noise power associated with the measurement instrument.

15. A measurement system for measuring a noise factor of a device under test (DUT), the measurement system comprising:
   a non transitory memory element storing data; and
   a processing unit configured to use at least a portion of the data to interoperate with a measurement instrument to:
      measure a first noise power when the DUT is not connected to the measurement instrument;
      determine a noise figure and noise temperature of the measurement instrument based at least on the measured first noise power and a first signal flow model representative of a signal measurement path exclusive of the DUT;
      measure a second noise power when the DUT is connected to the measurement instrument; and
      determine a noise figure of the DUT based at least on the measured second noise power, the noise figure and noise temperature of the measurement instrument and a second signal flow model representative of the signal measurement path inclusive of the DUT.

16. The measurement system of claim 15, further comprising:
   a termination coupled to an input of the measurement instrument and having a specified impedance.

17. The measurement system of claim 16, further comprising:
   intermediary components coupling the termination to the input of the measurement instrument;
   wherein the processing unit is configured to interoperate with the measurement instrument to:
      obtain a reflection coefficient value of the termination;
      obtain S parameters corresponding to the intermediary components; and
      obtain a reflection coefficient value of the measurement instrument.

18. The measurement system of claim 16, wherein the processing unit is configured to interoperate with the measurement instrument to:
   determine the noise figure and the noise temperature of the measurement instrument based in addition on at least one of the following:
      the obtained reflection coefficient value of the termination;
      the obtained S parameters; or
      the obtained reflection coefficient value of the measurement instrument.

19. The measurement system of claim 15, wherein first noise power is representative of a superposition of:
   available power corresponding to a termination coupled to an input of the measurement instrument and having a specified first impedance;
   available power corresponding to intermediary components coupling the termination to the input of the measurement instrument; and
   noise power associated with the measurement instrument.

20. The measurement system of claim 15, wherein the second noise power is representative of a superposition of:
   available power corresponding to a termination coupled to an input of the measurement instrument and having a specified first impedance;
   available power corresponding to power loss at an input of the DUT coupled to the output of the measurement instrument;
   available power corresponding to power loss at the DUT;
   available power corresponding to power loss at an output of the DUT; and
   noise power associated with the measurement instrument.

21. The measurement system of claim 20, wherein the processing unit is configured to interoperate with the measurement instrument to calculate the noise figure of the DUT according to the second signal flow model from:
   the measured second noise power;
   the available power corresponding to the termination;
   the available power corresponding to the power loss at the input of the DUT;
   the available power corresponding to the power loss at the DUT;
   the available power corresponding to the power loss at the output of the DUT; and
   the noise power associated with the measurement instrument.

* * * * *

UNITED STATES PATENT AND TRADEMARK OFFICE
CERTIFICATE OF CORRECTION

PATENT NO. : 10,371,733 B2
APPLICATION NO. : 15/398074
DATED : August 6, 2019
INVENTOR(S) : Prabhat Pal, Vinay Kumar Velkuru and Brian J. Avenell It is certified that error appears in the above-identified patent and that said Letters Patent is hereby corrected as shown below:

In the Claims

Claim 1, Column 12, Line 58 - 59, please delete "model representation" and insert --model representative--.

Claim 4, Column 13, Line 21, please delete "measurement based" and insert --measurement instrument based--.

Claim 7, Column 13, Line 50, please delete "noise figured of" and insert --noise figure of--.

Claim 8, Column 14, Line 9, please delete "connected to the the measurement" and insert --connected to the measurement--.

Claim 14, Column 15, Line 1, please delete "the measure second" and insert --the measured second--.

Claim 15, Column 15, Line 15, please delete "a non transitory memory" and insert --a non-transitory memory--.

Signed and Sealed this
Twelfth Day of November, 2019

Andrei Iancu
*Director of the United States Patent and Trademark Office*